United States Patent
Boy et al.

(10) Patent No.: US 8,040,653 B2
(45) Date of Patent: Oct. 18, 2011

(54) SURGE PROTECTOR

(75) Inventors: Jürgen Boy, Berlin (DE); Frank Werner, Berlin (DE)

(73) Assignee: EPCOS AG, Munich (DE)

( * ) Notice: Subject to any disclaimer, the term of this patent is extended or adjusted under 35 U.S.C. 154(b) by 223 days.

(21) Appl. No.: 11/911,434

(22) PCT Filed: Mar. 17, 2006

(86) PCT No.: PCT/DE2006/000483
§ 371 (c)(1), (2), (4) Date: Oct. 12, 2007

(87) PCT Pub. No.: WO2006/108374
PCT Pub. Date: Oct. 19, 2006

(65) Prior Publication Data
US 2008/0225458 A1    Sep. 18, 2008

(30) Foreign Application Priority Data
Apr. 12, 2005    (DE) .......................... 10 2005 016 848

(51) Int. Cl.
*H02H 1/00* (2006.01)
*H02H 1/04* (2006.01)
*H02H 3/22* (2006.01)
*H02H 9/06* (2006.01)

(52) U.S. Cl. ........................................ 361/117

(58) Field of Classification Search .......... 361/117, 361/118–120
See application file for complete search history.

(56) References Cited

U.S. PATENT DOCUMENTS

| 3,975,664 A | 8/1976 | Baumbach |
| 4,266,260 A | 5/1981 | Lange et al. |
| 4,305,109 A | 12/1981 | Schilling et al. |
| 4,433,354 A | 2/1984 | Lange et al. |
| 4,493,004 A | 1/1985 | Lange et al. |
| 4,493,006 A | 1/1985 | Lange et al. |
| 4,583,147 A | 4/1986 | Boy et al. |
| 4,665,337 A | 5/1987 | Watzke et al. |
| 4,739,439 A | 4/1988 | Boy |
| 4,769,736 A | 9/1988 | Boy |
| 4,797,778 A | 1/1989 | Boy |
| 4,831,485 A | 5/1989 | Boy et al. |
| 4,851,946 A | 7/1989 | Igarashi et al. |
| 4,866,563 A * | 9/1989 | Howard et al. ............... 361/124 |
| 5,142,194 A | 8/1992 | Jacubeit et al. |
| 5,142,434 A | 8/1992 | Boy et al. |

(Continued)

FOREIGN PATENT DOCUMENTS

DE    26 33 160    2/1977

(Continued)

OTHER PUBLICATIONS

Written Opinion for PCT/DE2006/000483.

(Continued)

*Primary Examiner* — Rexford N Barnie
*Assistant Examiner* — Christopher J Clark
(74) *Attorney, Agent, or Firm* — Fish & Richardson P.C.

(57) ABSTRACT

A surge protector includes a body having an outer surface, and a clamp snapped on the body. The clamp includes spring clips. The spring clips have at least two support areas that are in a substantially same plane. The surge protector may also include a center electrode and terminal electrodes on ends of the body.

18 Claims, 2 Drawing Sheets

U.S. PATENT DOCUMENTS

| | | |
|---|---|---|
| 5,151,630 A | 9/1992 | Boy et al. |
| 5,383,085 A | 1/1995 | Boy et al. |
| 5,388,023 A | 2/1995 | Boy et al. |
| 5,450,273 A | 9/1995 | Boy et al. |
| 5,633,777 A | 5/1997 | Boy et al. |
| 5,671,114 A | 9/1997 | Daumer et al. |
| 5,768,082 A | 6/1998 | Lange et al. |
| 5,768,085 A | 6/1998 | Boy et al. |
| 5,892,648 A | 4/1999 | Bobert et al. |
| 6,172,865 B1 | 1/2001 | Boy et al. |
| 6,362,945 B1 | 3/2002 | Bobert et al. |
| 6,421,218 B1 * | 7/2002 | Vo et al. ............... 361/117 |
| 6,424,514 B1 | 7/2002 | Boy et al. |
| 6,445,560 B1 | 9/2002 | Bobert et al. |
| 6,529,361 B1 | 3/2003 | Petschel et al. |
| 6,570,090 B1 | 5/2003 | Boy et al. |
| 6,710,996 B2 | 3/2004 | Bobert et al. |
| 6,724,605 B1 | 4/2004 | Boy et al. |
| 6,795,290 B2 | 9/2004 | Bobert et al. |
| 6,952,336 B2 | 10/2005 | Werner et al. |
| 7,612,294 B2 | 11/2009 | Boy et al. |
| 2003/0026055 A1 | 2/2003 | Bobert et al. |
| 2004/0066599 A1 | 4/2004 | Werner et al. |
| 2004/0094330 A1 | 5/2004 | Boy et al. |
| 2004/0150937 A1 | 8/2004 | Bobert et al. |
| 2005/0030690 A1 * | 2/2005 | Bobert et al. ............... 361/104 |
| 2008/0048545 A1 | 2/2008 | Boy et al. |
| 2008/0218082 A1 | 9/2008 | Boy et al. |
| 2008/0225458 A1 | 9/2008 | Boy et al. |

FOREIGN PATENT DOCUMENTS

| | | |
|---|---|---|
| DE | 100 59 534 | 6/2002 |
| DE | 102 53 166 | 5/2004 |
| JP | 47-11942 | 5/1972 |
| JP | 53-165541 | 12/1978 |
| JP | 59-54721 | 4/1984 |
| JP | 1-122585 | 5/1989 |
| WO | WO03/054892 | 7/2003 |

OTHER PUBLICATIONS

Search Report for PCT/DE2006/000483.

English Translation of International Preliminary Report on Patentability (includes English Translation of Written Opinion) in Application No. PCT/DE2006/000483, dated Dec. 11, 2007.

International Search Report in Application No. PCT/DE2006/000483, dated Jun. 30, 2006.

Examination report dated Jan. 28, 2011 received in corresponding application JP 2008-505724.

* cited by examiner

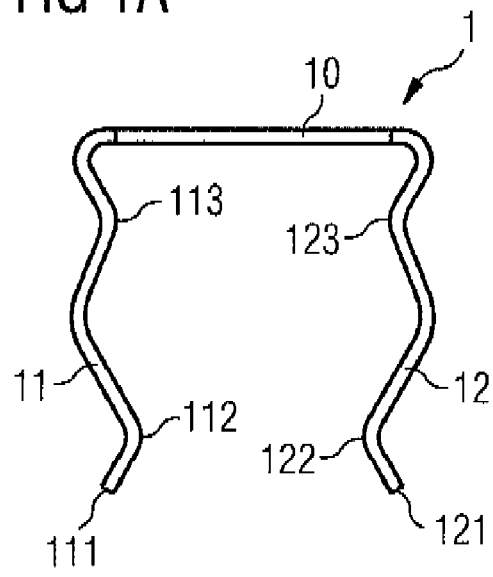
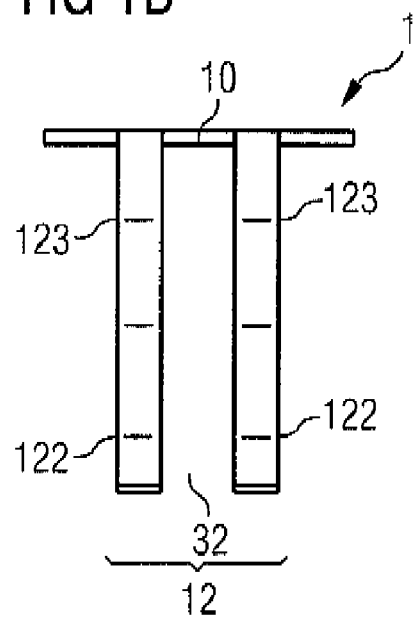
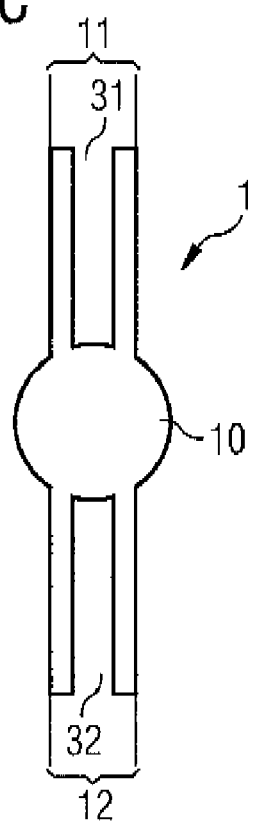

SURGE PROTECTOR

BACKGROUND

A three-electrode surge protector with snap-on contact elements is described in DE10253166A1. A three-electrode surge protector with a flattened electrode is described in DE10059534C1.

SUMMARY

Described herein is a simple mechanism for preventing a surge protector from rolling away during installation.

A surge protector may include a cylindrical body and a clamp. The clamp is snapped onto the body and has two spring clips. The spring clips have at least two support areas, which are in one and the same plane. This plane can be, e.g., outside of the body. Alternatively, the bottom side of the body can be in the plane.

As a result of the foregoing construction, the body can be prevented from rolling and, as a result, installation of the surge protector, e.g., on a circuit board, can be simplified. For this reason, the surge protector described herein is especially suitable for surface mounting.

Embodiments of the surge protector are described below.

The surge protector may be a gas-filled surge protector.

The body of the surge protector may be made from an electrically insulating material, such as ceramic.

All materials, including metals, which are suitable for constructing spring elements, can be used as the material for the clamp. However, the clamp can also be produced from an electrically insulating material.

The spring clips contact opposite sides of the outer surface of the body and exert a spring force on this surface.

A three-electrode surge protector may include an annular center electrode and two terminal electrodes arranged on the ends of the body.

In an embodiment, the support areas are in a common plane, which is outside of the body. In this way, an imaginary line, which in cross section connects the lowermost points of support areas of the two spring clips perpendicular to the spring clips, does not intersect the body. In one embodiment, however, this line can contact at least one area on the bottom side of the body. This area can be used for the surge protector as an additional support area.

The terminal electrodes can have a larger diameter than the body. Surfaces of the terminal electrodes facing downwards may be in the same plane as the support areas. Thus, in one embodiment, both the support areas and the terminal electrodes can be supported on a common base.

In one embodiment, the spring clips each have a slot. The center electrode can project past the edge of the surge protector and can engage in this slot. The spring clip is guided through the center electrode. The width of the slot relative to the width of the center electrode may be dimensioned so that the center electrode can be mounted in the slot.

The clamp may have a center piece connecting the spring clips to each other with a flat surface. The center piece may have a suction surface, which is advantageous for SMD mounting of the surge protector.

The clamp is connected rigidly to the body. But, it does not necessarily have to contact the body at each point. For example, for each spring clip, there can be at least two contact surfaces in which the clamp contacts the body.

The spring clips may be spread apart in order to increase the distance between the support areas and to increase the stability of the position of the surge protector on the base.

The clamp may be perpendicular to the longitudinal direction (cylinder axis) of the body. The clamp encloses the body along its extent, and the spring clips press onto the outer surface of the body. The clamps, however, can also be oriented in the longitudinal direction of the body such that the spring clips press on both ends of the body. Both spring clips are pulled downward at least to the bottom side of the body or beyond it.

Below, the surge protector is described with reference to figures that are not true to scale.

DESCRIPTION OF THE DRAWINGS

FIG. 1A, a first side view of a clamp;

FIG. 1B, a second side view of the clamp from FIG. 1A;

FIG. 1C, a view of the clamp from FIG. 1A in an extended state;

DETAILED DESCRIPTION

FIGS. 1A, 1B, and 1C show different views of a clamp 1 with a center part 10 and two spring clips 11, 12 attached to the center part. In this example, the clamp 1 has an integral construction.

Figure 2A:
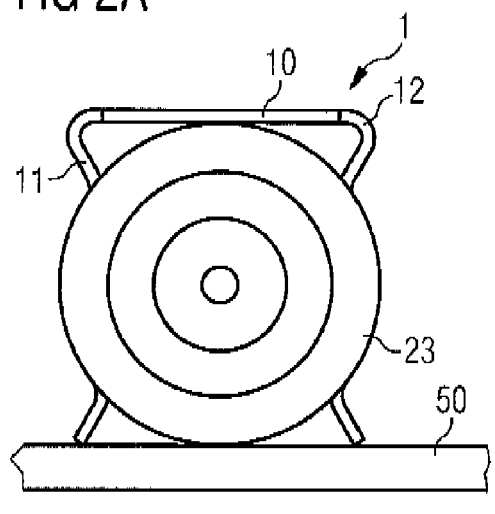
FIG. 2A, a first side view of the surge protector with a body and the clamp from FIG. 1A snapped onto this body.

The center part 10 of the clamp has a flat surface at its top. The spring clips 11, 12 exert a spring force on opposite sides of the outer surface. The spring clips 11, 12 each have supports areas 111, 121, which are turned downward and which are spread out downward. The support areas are turned downward and can be supported simultaneously against a base 50. The spring clips 11, 12 are also bent several times, such that they each have two contact surfaces 112, 113 and 122, 123, respectively, turned towards the body 40 of the surge protector (FIG. 2A). It is thereby possible to reduce the contact surface between the body and the clamp.

The spring clamps 11, 12 each have a slot 31 and 32, respectively, whose width is adapted to the width of an annular center electrode 22 of the surge protector.

Figure 2B:
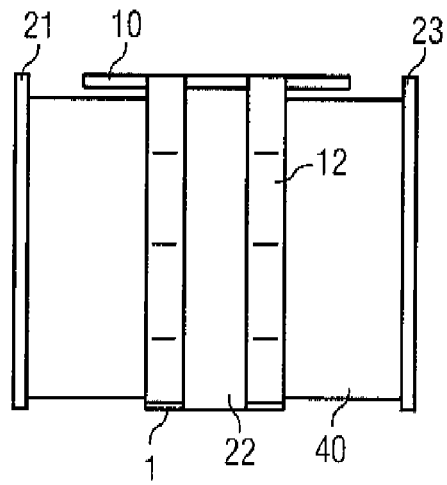
FIG. 2B, a second side view of the surge protector from FIG. 2A.
Figure 2C:
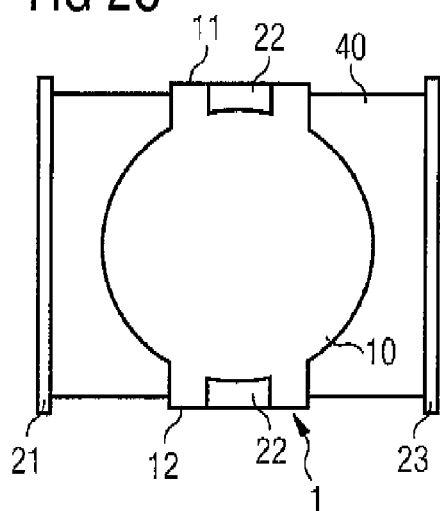
FIG. 2C, a view of the assembly from FIG. 2A from above.

In FIGS. 2A, 2B, and 2C, different views of an assembly are shown. The assembly comprises a surge protector with a cylindrical body 10 and the clamp 1 snapped onto the cylindrical body.

Terminal electrodes 21, 23, which have a greater diameter than the body 40, are arranged on the ends of the body 40. The center electrode 22 also has a greater diameter than the body 40.

The support areas 111, 121 of the spring clips, and also the areas of the electrodes 21, 22, 23 turned downward, are all in one plane.

The surge protector shown in FIGS. 2A to 2C with the clamp is suitable for surface mounting on a base 50. The clamp 1 can be removed after assembly.

Figure 3:
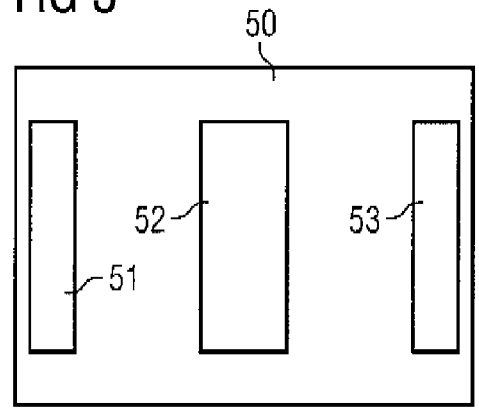
FIG. 3, a circuit board with a design of contact surfaces suitable for contacting the surge protector.

In FIG. 3, an example of a design of contact surfaces 51, 52, 53 of a circuit board is shown, which is used for the foregoing assembly as a base 50. The contact surface 52 is soldered to the center electrode 22. The contact surfaces 51 and 53 are each soldered to a terminal electrode 21 and 23, respectively.

The invention claimed is:

1. A surge protector comprising:
   electrodes;
   a body having an outer surface; and
   a clamp snapped onto the body, the clamp comprising spring clips;
   wherein the spring clips contact the body but not all of the electrodes;
   wherein the spring clips have at least two support areas that are in a substantially same plane and are on opposite sides of the body;
   wherein the plane is external to the body or tangential to a bottom part of the body; and
   wherein the clamp has a center part to interconnect the spring clips, the center part having a substantially flat surface that serves as a suction surface for SMD (surface mount device) mounting the surge protector.

2. The surge protector of claim 1, wherein the electrodes comprise:
   a center electrode; and
   terminal electrodes on ends of the body.

3. The surge protector of claim 2, wherein each terminal electrode has a greater diameter than the body.

4. The surge protector of claim 2, wherein each of the spring clips has a slot; and
   wherein a width of each slot is substantially equal to a width of the center electrode.

5. The surge protector of claim 1, wherein each spring clip has at least two contact surfaces for contacting to the body.

6. The surge protector of claim 1, wherein the spring clips are spread open.

7. The surge protector of claim 1, wherein the body is substantially cylindrical.

8. The surge protector of claim 1, wherein the support areas are supportable on both sides against a base.

9. The surge protector of claim 1, wherein there are two spring clips in the surge protector.

10. The surge protector of claim 3, wherein each of the spring clips has a slot; and
    wherein a width of each slot is substantially equal to a width of the center electrode.

11. The surge protector of claim 2, wherein each spring clip has at least two contact surfaces for contacting to the body.

12. The surge protector of claim 2, wherein the spring clips are spread open.

13. The surge protector of claim 2, wherein the body is substantially cylindrical.

14. The surge protector of claim 3, wherein each spring clip has at least two contact surfaces for contacting to the body.

15. The surge protector of claim 3, wherein the body is substantially cylindrical.

16. The surge protector of claim 1, wherein the electrodes comprise:
    a center electrode; and
    terminal electrodes comprising a terminal electrode on each end of the body, each terminal electrode having a greater diameter than the body, the body being substantially cylindrical in shape;
    wherein each of the spring clips has a slot, a width of each slot being substantially equal to a width of the center electrode, and each spring clip having at least two contact surfaces for contacting to the body.

17. The surge protector of claim 16, wherein the plane is tangential to a bottom part of the terminal electrodes.

18. A surge protector comprising:
    electrodes;
    a body having an outer surface;
    a clamp snapped onto the body, the clamp comprising spring clips; and
    terminal electrodes comprising a terminal electrode on each end of the body;
    wherein the spring clips contact the body but not all of the electrodes;
    wherein the spring clips have at least two support areas that are in a substantially same plane and are on opposite sides of the body;
    wherein the plane is tangential to a bottom of at least one of the terminal electrodes; and
    wherein the clamp has a center part to interconnect the spring clips, the center part having a substantially flat surface that serves as a suction surface for SMD (surface mount device) mounting the surge protector.

* * * * *